United States Patent [19]

Temple et al.

[11] 4,165,517
[45] Aug. 21, 1979

[54] SELF-PROTECTION AGAINST BREAKOVER TURN-ON FAILURE IN THYRISTORS THROUGH SELECTIVE BASE LIFETIME CONTROL

[75] Inventors: Victor A. K. Temple, Clifton Park; B. Jayant Baliga, Schenectady, both of N.Y.

[73] Assignee: Electric Power Research Institute, Inc., Palo Alto, Calif.

[21] Appl. No.: 856,832

[22] Filed: Dec. 2, 1977

Related U.S. Application Data

[62] Division of Ser. No. 772,712, Feb. 28, 1977, abandoned.

[51] Int. Cl.² .............................................. H01L 29/74
[52] U.S. Cl. ......................................... 357/38; 357/64; 357/91; 357/86
[58] Field of Search ......................... 357/38, 64, 91, 86

[56] References Cited

U.S. PATENT DOCUMENTS

| | | | |
|---|---|---|---|
| 3,943,549 | 3/1976 | Jaecklin et al. | 357/64 |
| 4,040,170 | 8/1977 | Schlegel et al. | 357/38 |

Primary Examiner—Joseph E. Clawson, Jr.
Attorney, Agent, or Firm—Townsend and Townsend

[57] ABSTRACT

A thyristor is protected against voltage breakover turn-on failure by selective control of the minority charge carrier lifetime in the base region and in the gate region to establish a predictable location of the voltage breakover turn-on in the gate region. Carrier lifetime modification in the selected gate region is achieved by shielding the gate region during electron irradiation of the high-lifetime silicon substrate to protect against lifetime-killing radiation defect centers, by annealling the gate region after electron irradiation to a temperature threshold known to eliminate the radiation-induced defects, or by introducing lifetime killing defects, such as gold or platinum, external to the gate region, typically by selective diffusion or localized ion implantation. As a result, a locally higher gate sub-transistor gain thyristor is attained, so that the turn-on criterion, the unity product of the base transport factor and the avalanche multiplication factor, is established at a lower voltage in the gate region than elsewhere in the thyristor device.

7 Claims, 5 Drawing Figures

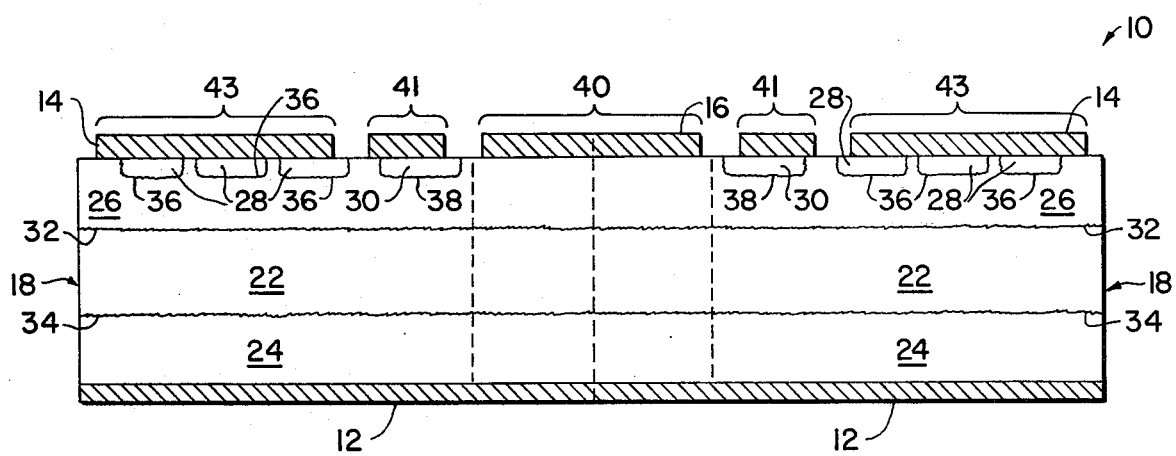
FIG._1.
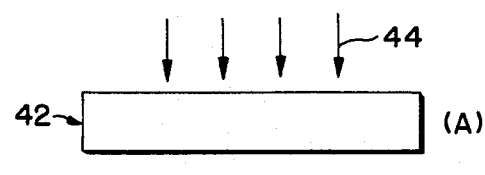
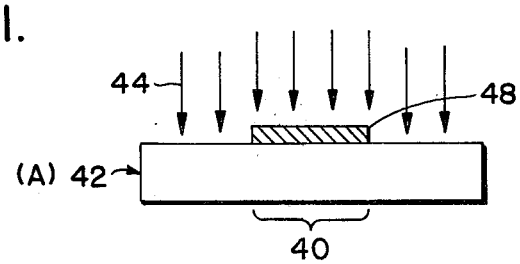
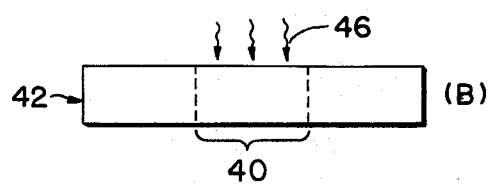
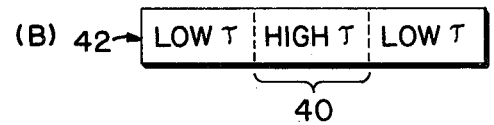
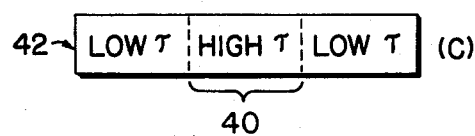
FIG._2.
FIG._3.

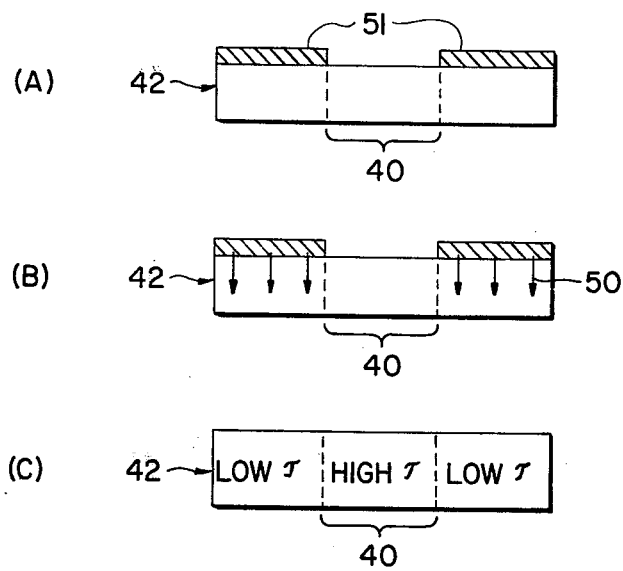
FIG._4.
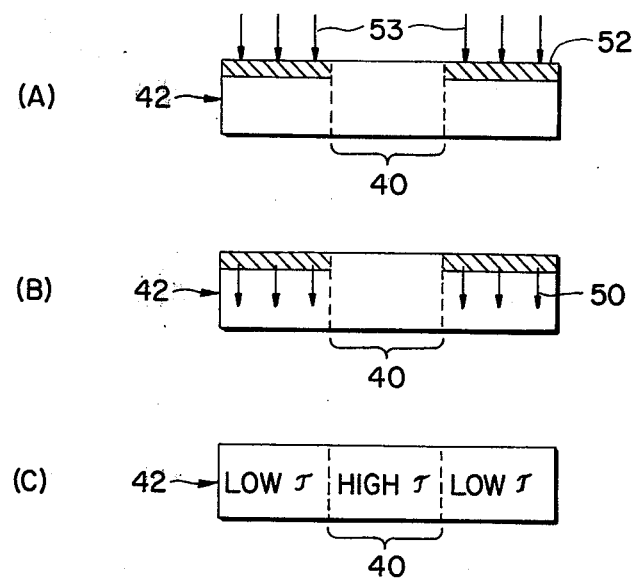
FIG._5.

SELF-PROTECTION AGAINST BREAKOVER TURN-ON FAILURE IN THYRISTORS THROUGH SELECTIVE BASE LIFETIME CONTROL

This is a Division of application Ser. No. 772,712, filed 2/28/77 now abandoned.

BACKGROUND OF THE INVENTION

This invention was made under contact with or supported by the Electric Power Research Institute, Inc. of Palo Alto, California.

1. Field of Invention

This invention relates to the fabrication of solid state devices and relates particularly to self-protection of thyristor devices and the like.

A thyristor is a solid state device having alternate layers of P type and N type semiconductor materials. A thyristor is typically a disc of four alternating layers of N and P type silicon, the layers and junctions between them being formed by precision gaseous diffusion, substrate fusion and/or alloying techniques. A thyristor has generally three electrodes, referred to as the cathode, the anode, and the gate, the gate being the control electrode for the device. During normal operation, the thyristor is turned on by at least momentary application of a forward bias gate-to-cathode voltage. The device remains on until the anode-to-cathode voltage is reduced to a value below that required to sustain regeneration, or forward current.

The thyristor may also be turned on without a voltage applied to the gate if the anode-to-cathode voltage exceeds a value inherent in the device design. This phenomenon is known as voltage breakover turn-on. The main emitter area in the cathode of a thyristor is prone to failure during breakover turn-on initiated by such excess device voltage. The location of the turn-on point within the device is not usually subject to control. As a result, the turn-on point may often occur within the cathode emitter in a manner causing permanent device failure.

The device turn-on criterion, which is based on the current gain of the transistor formed by the anode layer, the anode base layer and the cathode base layer of the thyristor device, is approximated to the first order as the product of the anode base transport factor $a_T$ and the avalanche multiplication factor M. (Strictly speaking, the turn-on criterion is the product of the current gain factor, $a_0$, and the multiplication factor, M. However, because current gain, $a_0$, is the product of the anode base transport factor, $a_T$, and the emitter efficiency, $\gamma_E$, of the anode emitter, which is close to unity and does not vary strongly with voltage, to the first order $a_0 \approx a_T$. Therefore, the subscript may be ignored and the terms current gain and base transport factor may be used interchangeably.) Both the base transport factor and the avalanche multiplication factor are voltage sensitive parameters. An excess forward voltage will cause the product $a.M$ to prematurely exceed unity within selected regions of the thyristor, resulting in a local current gain approaching infinity. Device turn-on in this manner often causes device failure.

2. Description of the Prior Art

In the past, there have been two basic methods for protecting against voltage breakover turn-on failure. In the first method, external circuitry is connected between the anode and the gate which has a breakover voltage below that of the internal emitter to be protected. As voltage between the anode and cathode approaches the breakover level, the resulting avalanche current in the external circuitry becomes the gate current of the thyristor, thereby firing the thyristor normally. One of the major shortcomings of this type of breakover protection is the need for additional external circuit components, with the resultant increased expense and system size.

A second method involves the use of internal auxiliary fabrication techniques, wherein the silicon wafer from which the N type base region is fabricated is prepared so that the highest donor concentration is located precisely below the area for the gate contact. This method is described in an article by Peter Voss, *Solid State Electronics*, Volume 27, page 265 (1974). In the Voss method, the dependence of the avalanche breakdown characteristic on donor concentration assures that the doped region is the first region in which breakdown can occur, thereby protecting against voltage breakover turn-on failure in any other region of the thyristor.

Thyristors and many other semiconductor devices are fabricated from a wafer of silicon, initially of high purity, which is characterized by a long charge carrier lifetime. In the course of fabrication it is common practice to uniformly irradiate the wafer or to introduce a lifetime reducing impurity uniformly into the wafer surface to modify the characteristic of the silicon wafer. This technique can be adapted to advantage as hereinafter described.

SUMMARY OF THE INVENTION

A thyristor is protected against voltage breakover turn-on failure by selective control of the minority charge carrier lifetime in the base of the gate region to establish a predictable location of the voltage breakover turn-on in the gate region. Carrier lifetime modification in the selected gate region is achieved by either shielding the gate region during electron or other defect-inducing irradiation of the high-lifetime silicon substrate to protect against lifetime-killing radiation defect centers or by heat annealling the gate region after electron irradiation to a temperature threshold known to eliminate the radiation induced defects in that region.

Alternatively, lifetime reducing impurities may be introduced over all portions of the cathode with the exception of the gate region, by either selective diffusion from a localized source or by localized ion implantation followed by localized diffusion. As a result, a locally higher anode to anode-base to cathode-base subtransistor current gain, $a_0$, (corresponding to the anode base transport factor, $a_T$) is attained, so that the turn-on criterion, now taken as the unity product of the anode-base transport factor, $a_T$, and the avalanche multiplication factor, M, is established at a lower voltage in the gate region than elsewhere in the thyristor device.

BRIEF DESCRIPTION OF THE DRAWINGS

The invention will be best understood by reference to the following detailed description of preferred embodiments, taken in conjunction with the following drawings, in which:

FIG. 1 is a schematic cross-section illustrating a section of an amplifying gate type thyristor device constructed according to the method of the present invention;

FIG. 2 shows cross-sections of silicon wafers illustrating the steps of fabrication according to a first preferred embodiment of the invention;

FIG. 3 illustrates a second preferred method for fabrication according to the invention;

FIG. 4 illustrates a third preferred method for fabrication according to the invention; and FIG. 5 illustrates a fourth preferred method of fabrication according to the invention.

DETAILED DESCRIPTION OF THE PREFERRED EMBODIMENTS

In order to understand the inventive process, it is helpful to examine the structure and characteristics of a semiconductor thyristor 10 according to the invention, as shown in FIG. 1. The thyristor 10 comprises an anode contact 12, a cathode contact 14, and a gate contact 16 in ohmic contact with first and second sides of a generally disc shaped silicon wafer substrate 18. The gate contact 16 is typically located near the center of the substrate 18, and in some designs it may be surrounded by an annular cathode contact 14.

The thyristor 10 comprises distinct joined semiconductor layers. The semiconductor layers are designed the anode base or wide base or simply the $N_{base}$ layer 22, the anode P or $P_{anode}$ layer 24, the cathode base or $P_{base}$ layer 26 and discontinuous layers 28 and 30. The layer 28 is known as the main emitter layer 28 and the layer 30 which is between the cathode contact 14 and the gate contact 16 is known as the gate emitter or pilot thyristor emitter layer 30.

The anode base layer 22 is sandwiched between the anode layer 24 and the cathode base layer 26. The anode layer 24 is in ohmic contact through metallization of the anode contact 12. The emitter layers 28 and 30 may be a high dopant concentration N-type semiconductor fused or diffused over portions of the cathode base layer 26. The cathode base layer 26 is in ohmic contact with metallization of the cathode 14 through shorts in the main emitter layer 28 and with metallization of the gate contact 16. The anode base layer shares a relatively large semiconductor junction 32 with the cathode base layer 26 and a further relatively large semiconductor junction 34 with the anode layer 24. The cathode base layer shares semiconductor junctions 36 and 38 with emitter layers 28 and 30.

Thyristor 10 is further characterized by a number of operating regions. The region between the area of the gate contact 16 and the anode contact 12 which roughly corresponds to the area under the gate contact 16 is designated the gate region 40. The region roughly corresponding to the area under the gate emitter layer 30 is designated the gate or pilot thyristor region 41. The relatively broad area between the cathode contact 14 and the anode contact 12 is generally known as the main thyristor region 43.

Thyristor 10 shown in FIG. 1 is known as an amplifying gate thyristor because of the presence of the pilot thyristor region 41. A subtransistor is defined by gate region 40 as indicated by the phantom line through layers 26, 22 and 24. In proper operation, the gate or pilot thyristor 41 is initially turned on by the lateral flow of current between the gate contact 16 and the cathode contact 14. Once the pilot thyristor 41 is on the main thyristor 43 is turned on by gate-to-cathode current plus current flowing between the anode contact 12 below the gate emitter region 30 and the cathode contact 14. According to the method of the present invention, control of the local gain characteristics interior to the gate emitter region 30, i.e. in the gate region 40, inhibits device failure due to voltage breakover caused by excessive forward voltage between the anode 12 and the cathode 14. Regional path control results in an operational geometry which causes the current through the subtransistor in gate region 40 first to turn on the pilot thyristor region 42 and thereafter the main thyristor region 43 if excessive forward voltage occurs. In structures omitting the pilot thyristor region, the geometry is such that the main thyristor region 43 is turned on by the current resulting from the excessive forward current.

The operation of the thyistor 10 is defined by well-known localized semiconductor characteristics. For example, the turn-on point along the N-P junction 32 is determined by the product of the localized base transport factor $\alpha$, which approximates the current gain characteristic, and of the avalanche multiplication factor M. At the point $\alpha.M$ first equals or exceeds unity along the N-P junction 32, avalanche current begins to flow.

The multiplication factor M and the transport factor are both voltage dependent. The transport factor is approximated by the equation:

$$d(V) = \frac{2}{\exp\left(\frac{W(V)}{L_p}\right) + \exp\left(\frac{-W(V)}{L_p}\right)} \quad (1)$$

where:

W(V) is the undepleted base width at applied voltage; and $L_p$ is the base minority carrier diffusion length in the $N_{base}$ layer 22.

$L_p$ is defined by the expression:

$$L_p = (D_p \tau_p)^{\frac{1}{2}} \quad (2)$$

$D_p$ is the characteristic minority charge-carrier diffusion coefficient in the $N_{base}$ material; and $\tau_p$ is the lifetime of excess minority charge carriers in the $N_{base}$ layer 22.

The abrupt junction approximation for the multiplication factor M is given by the expression:

$$M(V) = \frac{1}{1 - \left(\frac{V}{V_{BR}}\right)^n} \quad (3)$$

where:

V is the applied voltage; and $V_{BR}$ is the characteristic breakdown voltage.

The abrupt junction approximation is insufficiently accurate in the case of most diffusion formed junctions. More exact expressions are found in the literature and may, for example, be found in S. M. Sze, *Physics of Semiconductor Devices*, Wiley Interscience Press, 1969.

The avalanche multiplication factor M and the transport factor $\alpha$ may vary locally along the N-P junction 32. For the purposes of explanation, the multiplication factor along the N-P junction 32 external to region 40 is designated $M_M$, the transport factor in the N base layer 22 external to region 40 is designated $\alpha_M$, the multiplication factor in the gate region 40 is designated $M_G$, and the transport factor in the gate region 40 is designated $\alpha_G$.

Since the turn-on criterion is $\alpha.M=1$, the location of the turn-on point can be controlled by relative modification of the transport factors $\alpha_G$ and $\alpha_M$. Specifically, $\alpha_G$ is established according to the invention to be greater than $\alpha_M$, so that initial device turn-on is constrained to occur in the gate region 40 and along the inner portion of P-N junction 38.

An examination of equation (1) above indicates that $\alpha_G$ is physically dependent upon the charge-carrier diffusion length $L_P$ in the regions of interest. Equation (2) indicates that the charge-carrier diffusion length $L_P$ is directly dependent on charge-carrier lifetime $\tau_P$. Therefore, localized modification of the charge-carrier lifetime $\tau_P$ governs the location of device turn-on.

FIGS. 2 and 3 illustrate possible methods for achieving the desired control of localized carrier lifetime $\tau$, and therefore of the transport factor $\alpha$, during fabrication of the thyristor device 10 illustrated in FIG. 1.

According to the inventive method of FIG. 2, a high purity silicon wafer substrate 42 is first irradiated, for example, with uniform electron irradiation 44 according to well-known methods in the art, as shown in (A) of FIG. 2. (See, for example, Tarnega & Johnson, "Tailoring the recovered charge in power diodes using 2MeV electron irradiation," Electrochem. Society Mtg., Paper 261 RNP 1975). This introduces lifetime killing defect centers permeating the wafer 42. Thereafter, the wafer 42 is subjected to localized heat annealling 46 in the gate region 40, as shown in (B) of FIG. 2. The heat annealling step 46 anneals out the liftime killing defect centers in the crystal structure of the wafer 18, thereby increasing the lifetime $\tau$ hence the transport factor $\alpha$ in the gate region 40. The temperatures at which heat anneals out defects induced by required irradiation levels for silicon are well known in the art and in the literature. The results of the above-described processing steps are localized variations in the charge-carrier lifetime of the silicon substrate 42, as depicted in (C) of FIG. 2, which results in the relatively higher transport factor, $\alpha_G$, in the gate region 40.

FIG. 3 illustrates an even simpler and somewhat more versatile method for creating localized variation in the charge carrier lifetime in the silicon substrate 42. As depicted in (A) of FIG. 3, a shield 48 is placed over the gate region 40, whereupon the substrate is irradiated with electrons or other defect inducing radiation. As a consequence, the gate region 40 under the shield 48 is protected against the creation of lifetime killing defects. The result is a silicon substrate 42 having locally varying charge carrier lifetimes, as depicted in (B) of FIG. 3.

The shield 48 is preferably a removable mask such as lead foil. The shield 48 may be mechanically held in place, as necessary. Should modification of the gate region lifetime be desired, the shield 48 may be removed from the gate region 40 during a portion of the irradiation process. The method illustrated in FIG. 3 is particularly versatile since the shield 48 can be provided for any length of time at any stage in the device fabrication process, but the method is performed most conveniently after junction formation and metallization.

FIG. 4 illustrates a further method for creating a desired localized variation in the charge carrier lifetime in the silicon substrate 42. As depicted in (A), a patterned source of lifetime reducing impurities 51 is first deposited on the surface of the substrate 42 except in the area of the gate region 40. The impurity material may comprise, for example, gold or platinum, and the layer may be emplaced by metal evaporization, or by deposit of a CVD/spun-on glass containing the impurity. General procedures for gold doping to control lifetime characteristics have been discussed in reference to particular applications in the literature. See, for example, Fairfield & Gokhale, "Control of diffused diode recovery time through gold doping," Solid State Electronics, Vol. 9, pp. 905-907, 1966. Such techniques may be adapted to the present method. After deposition of the impurity layer, diffusion 50 is induced to urge the impurities to migrate into the substrate 42, which creates the desired lifetime-killing defects, as depicted in (B). The result is a substrate 42, depicted in (C), having a gate region of selective high liftime.

FIG. 5 illustrates a still further method for achieving the desired profile of charge carrier lifetime. As depicted in (A) a layer of a lifetime reducing impurity 52, such as gold or platinum, is deposited by ion implantation 53 on the surface of substrate 42 in the regions other than the gate region 40. Thereafter, the impurity is diffused into the substrate 42, as depicted in (B). Consequently, a locally higher lifetime and hence a higher gate region transport factor is created, as depicted in (C).

Gold doping is a relatively straightforward means for controlling the lifetime. For example, in the fabrication of a gold doped inverter type thyristor, control of the lifetime and thereby the base transport factor $\alpha$ may be achieved by merely assuring that the gate region 40 is not doped with gold.

Examples are hereafter presented to illustrate the selection of appropriate gate region transport factor values for particular substrate doping profiles. Consider first a device substrate such as illustrated in FIG. 1 having a constant carrier density of electron $N=3\times 10^{13}$ electrons/cm$^3$, a thickness of about 20 mils, a large $\tau_{po}$ (e.g., in excess of 30 $\mu$sec), and P regions 24 and 26 formed by a 7 mil diffusion depth with a surface density $N_s=3\times 10^{16}$ carriers/cm$^3$. Table I gives values for the multiplication factor of suitable accuracy for a substrate having this doping profile.

TABLE I

| V | M |
|---|---|
| 4520 | ∞ |
| 4220 | 8 |
| 4190 | 4 |
| 4100 | 2 |
| 3970 | 1.5 |
| 3870 | 1.25 |
| 3725 | 1.125 |

The lifetime $\tau_M$ of layer 22 external of region 40 is reduced by the method of the invention to 15 $\mu$sec., which is approximately one-half the lifetime in the gate region 40. This yeilds a minority carrier diffusion length of L=approximately 5.3 mils. Where the imposed voltage across the main portion of N-P junction 32, $V_{nbase}$, is known to be about 3350 volts. This corresponds to an undepleted base width of W(V)=5.3 mils. From equation (1), therefore, $\alpha_M$ (4050)≈0.65 across the main portion of junction 32. The avalanche multiplication factor at the main portion of junction 32, from Table I, is $M_M(4050) \approx 1.75$. Therefore, the turn-on criterion $\alpha_M M_M = 1.13$, indicating that the breakover voltage in the main portion of the thyristor 10 would be approximately 4000 volts.

After treatment according to the inventive methods, the minority carrier $\tau_{po}$ in the gate region is adjusted to about 30 $\mu$sec. or about twice as long as the time constant in the main portion of $n_{base}$ layer 22. This yields a characteristic minority carrier diffusion length, $L \approx$ approximately 7.5 mils. At 3900 volts, the junction voltage in gate region 40 of FIG. 1 is about 3200 volts. Therefore, by well-known relationships, $W(V) \approx 5.6$ mils. From equation (1), it follows that $\alpha_G(3900) \approx 1.37$, from Table I. It follows that the turn-on criterion is $\alpha.M = 1.06$, indicating a breakover voltage in the gate emitter region 40 to be about 3850 volts, i.e. about 150 volts below the breakover voltage in any other portion of the thyristor 10. Thus, device breakover turn-on and current conduction should occur in the gate region 40 rather than in some other undesirable location.

It should, of course, be noted that these calculations assume that the edge region of the thyristor has a characteristic breakdown voltage which is larger than 3850 volts. Relatively good edge passivation is maintained to this end, as is routinely done in the industry.

The concern about the breakdown voltage at the edge of the substrate 18 places an effective lower bound on the emitter gate transport factor $\alpha_G$. For the breakover voltage to be higher in the main portion of the junction 32, a basic criterion is that $\alpha_M$ be less than $\alpha_G$, which requires that the localized minority diffusion length L in this region be reduced. Should $\alpha_M$ and $L_M$ be too low, however, a large increase in the forward voltage drop may result.

On the other extreme, if $\alpha_G$ is increased substantially, there is a resultant substantial increase in sensitivity to leakage current and to the so-called dV/dt current in the gate region 40 which is increased by an amount proportional to the gate region subtransistor gain and the area of gate region 40. In order to minimize the change in the dV/dt rating of the thyristor 10, gate region 40 may be reduced in area.

The previous calculation was valid for a substrate characterized by an electron density constant of $3 \times 10^{13}/cm^3$. For a device fabricated from a substrate 18 characterized by an electron density of $5 \times 10^{13}$ electron/$cm^3$, and 2 layer thickness of 15 mils, utilizing equation (1) above and Table II below, the breakover voltage on the junction 32 of the thyristor 10 external to region 40 is calculated to be approximately 2800 volts with a charge-carrier lifetime $\tau_{po} = 5$ μsec. The breakover voltage in the gate region 40 is computed to be about 2500 volts with a carrier lifetime $\tau_{po} = 20$ μsec., or about four times the lifetime in the main emitter region 28. Thus, the difference in breakover voltage between the gate region 40 and the main portion of the junction region 32 is approximately 300 volts.

TABLE II

| V    | M     |
|------|-------|
| 3070 | 8     |
| 3040 | 44    |
| 2960 | 2     |
| 2880 | 1.5   |
| 2775 | 1.25  |
| 2680 | 1.125 |

These calculations merely illustrate the magnitude of difference in breakover voltage which may be obtained by localized control of the minority carrier lifetime $\tau$, upon which the base transport factor $\alpha$, and thereby the turn-on criterion $\alpha.M$, is regulated.

Other specific embodiments of the inventive method will be apparent in light of this disclosure. It is therefore not intended that this invention be limited, except as indicated by the appended claims.

We claim:

1. A thyristor semiconductor device protected against voltage breakover failure, said device for use in connection with means for applying voltage and for generating electrical currents, comprising a silicon substrate having on an obverse face an anode contact and on a reverse face a cathode contact and a gate contact, said gate contact being spaced laterally from said anode contact, said substrate including a main thyristor region between the anode contact and the cathode contact, a gate subtransistor region between the anode contact and the gate contact and a gate emitter region substrate between the gate contact and the cathode contact establishing a pilot thyristor region, said pilot thyristor region being operatively coupled to said main thyristor region to turn on said main thyristor region when said pilot thyristor region is turned on, said gate subtransistor region being characterized by a locally longer minority carrier lifetime than the minority carrier lifetime in any area of the main thyristor region, such that excessive forward voltage causes currents initially to flow only in the gate subtransistor region and act to turn on said pilot thyristor region.

2. A thyristor device according to claim 1 wherein the minority carrier lifetime in the gate region is at least about two times longer than elsewhere in said substrate.

3. A thyristor semiconductor device according to claim 1 wherein the gate subtransistor region includes a base region, said subtransistor base region having the maximum minority charge carrier lifetime in said substrate.

4. A semiconductor device protected against breakover turn-on failure and operative in connection with means for applying voltage and for generating electrical currents comprising a silicon base substrate having:

a main thyristor region with at least a main emitter area;

a gate region operatively associated with said main thyristor region for turning on currents in said main thyristor region in response to a condition turning on currents in said gate region, said gate region including a localized subtransistor, said subtransistor being characterized by a locally longer minority charge carrier lifetime than the minority charge carrier lifetime in all areas of said main thyristor region such that the location of initial current conduction under conditions of excessive forward voltage is limited to said gate region.

5. A semiconductor device according to claim 4 wherein said gate region is disposed within said main thyristor region.

6. A semiconductor device according to claim 4 wherein the minority charge carrier lifetime of said subtransistor is at least twice the minority charge carrier lifetime than the minority charge carrier lifetime in all areas of said main thyristor region.

7. A semiconductor device according to claim 6 further including a pilot thyristor region operatively, coupled with said main thyristor region for turning on currents in said main thyristor region upon the turning on of currents in said subtransistor.

* * * * *

UNITED STATES PATENT AND TRADEMARK OFFICE
CERTIFICATE OF CORRECTION

PATENT NO. : 4,165,517
DATED : August 21, 1979
INVENTOR(S) : Temple et al.

It is certified that error appears in the above—identified patent and that said Letters Patent is hereby corrected as shown below:

In claim 1, line 7, change "anode" to --cathode--.

Signed and Sealed this

Twenty-second Day of April 1980

[SEAL]

Attest:

SIDNEY A. DIAMOND

Attesting Officer  Commissioner of Patents and Trademarks